(12) United States Patent
Lin et al.

(10) Patent No.: US 8,974,867 B2
(45) Date of Patent: Mar. 10, 2015

(54) METHOD FOR MAKING STRIP SHAPED GRAPHENE LAYER

(71) Applicants: Tsinghua University, Beijing (CN); Hon Hai Precision Industry Co., Ltd., New Taipei (TW)

(72) Inventors: Xiao-Yang Lin, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 3 days.

(21) Appl. No.: 13/730,859

(22) Filed: Dec. 29, 2012

(65) Prior Publication Data
US 2013/0266738 A1  Oct. 10, 2013

(30) Foreign Application Priority Data
Apr. 5, 2012  (CN) .......................... 2012 1 0096865

(51) Int. Cl.
| C23C 14/18 | (2006.01) |
| C23C 14/48 | (2006.01) |
| C23C 14/06 | (2006.01) |
| C23C 14/58 | (2006.01) |

(52) U.S. Cl.
CPC ............. *C23C 14/48* (2013.01); *C23C 14/0605* (2013.01); *C23C 14/5806* (2013.01)
USPC ............................ 427/523; 427/528; 427/526

(58) Field of Classification Search
USPC .......................................... 427/528, 523, 526
See application file for complete search history.

(56) References Cited

U.S. PATENT DOCUMENTS

| 2010/0124622 | A1* | 5/2010 | Wang et al. .................. 427/596 |
| 2010/0323113 | A1* | 12/2010 | Ramappa et al. .......... 427/398.1 |
| 2010/0327956 | A1 | 12/2010 | Karkkainen et al. |

FOREIGN PATENT DOCUMENTS

TW  201100324  1/2011

OTHER PUBLICATIONS

A. Fasoli et al.; "Fabrication of grapheme nanoribbons via nanowire lithography"; Phys. Status Solidi B, vol. 246, No. 11-12, p. 2514-2517, Oct. 29, 2009.
Dacheng Wei et al.; "Scalable synthesis of few-layer graphene ribbons with controlled morphologies by a template method and their applications in nanoelectromechanical switches"; J. Am. Chem. Soc., vol. 131, p. 11147-11154, Jul. 20, 2009.

* cited by examiner

*Primary Examiner* — Dah-Wei D Yuan
*Assistant Examiner* — Nga Leung V Law
(74) *Attorney, Agent, or Firm* — Novak Druce Connolly Bove + Quigg LLP

(57) ABSTRACT

A method for making a strip shaped graphene layer includes the following steps. First, a carbon nanotube structure on a surface of a metal substrate is provided. The carbon nanotube structure includes at least one drawn carbon nanotube film. The at least one drawn carbon nanotube film includes a number of carbon nanotube segments, each of the number of carbon nanotube segments being substantially parallel to each other and separated from each other by a strip-shaped gap. Second, carbon ions are implanted into the metal substrate through the strip-shaped gaps. Third, the metal substrate is annealed to obtain the strip shaped graphene layer.

19 Claims, 8 Drawing Sheets

METHOD FOR MAKING STRIP SHAPED GRAPHENE LAYER

CROSS-REFERENCE TO RELATED APPLICATIONS

This application claims all benefits accruing under 35 U.S.C. §119 from China Patent Application No. 201210096865.3, filed on Apr. 5, 2012, in the China Intellectual Property Office, the contents of which are hereby incorporated by reference.

BACKGROUND

1. Technical Field

The present disclosure relates to a method for making a strip shaped graphene layer.

2. Description of Related Art

Graphene is an allotrope of carbon with a structure of one-atom-thick planar sheets of $sp^2$-bonded carbon atoms that are densely packed in a honeycomb crystal lattice. Graphene can be most easily visualized as an atomic-scale chicken wire made of carbon atoms and their bonds. The crystalline or "flake" form of graphite consists of many graphene sheets stacked together.

The carbon-carbon bond length in graphene is about 0.142 nanometers. Graphene sheets stack to form graphite with an interplanar spacing of 0.335 nanometers. Graphene is a basic structural element of some carbon allotropes including graphite, charcoal, carbon nanotubes, and fullerenes. It can also be considered as an indefinitely large aromatic molecule, and the limiting case of the family of flat polycyclic aromatic hydrocarbons.

Graphene has excellent electrical and thermal properties. An electron mobility of graphene at room temperature is about 15000 $cm^2V^{-1}$ $s^{-1}$. A thermal conductivity of the graphene is about 3000 $Wm^{-1}K^{-1}$. Graphene can be used on the semiconductor devices, such as, sensors, transistors, solar cells, thin film transistors, and so on. In such applications, a strip shaped graphene layer is needed.

What is needed, therefore, is to provide a method for making a strip shaped graphene layer.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
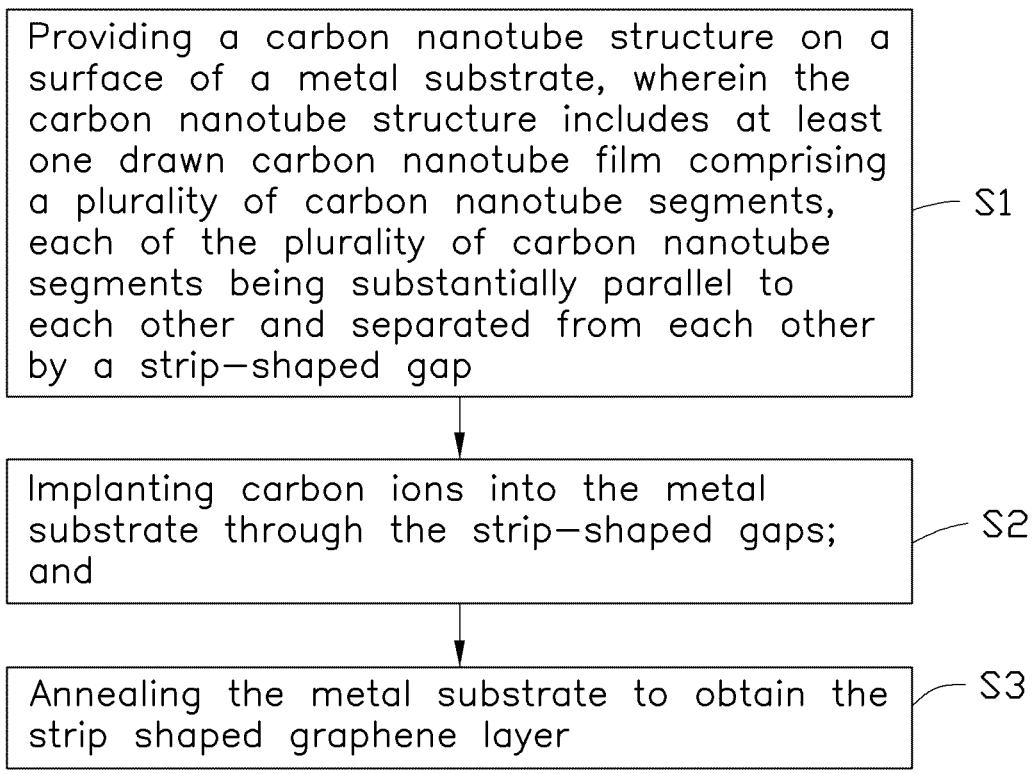
FIG. 1 shows a flowchart of one embodiment of a method for making a strip shaped graphene layer.
Figure 2:
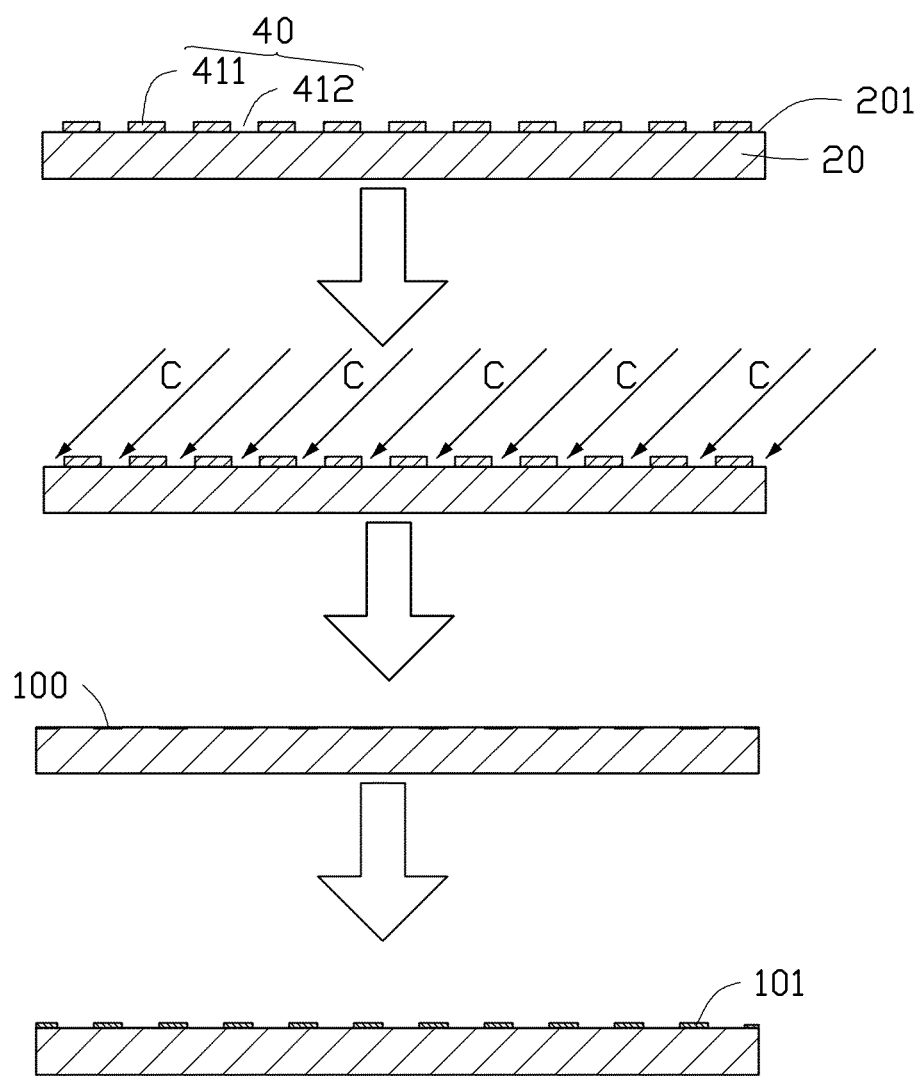
FIG. 2 shows a number of cross-sectional views of the method for making the strip shaped graphene layer in FIG. 1.
Figure 3:
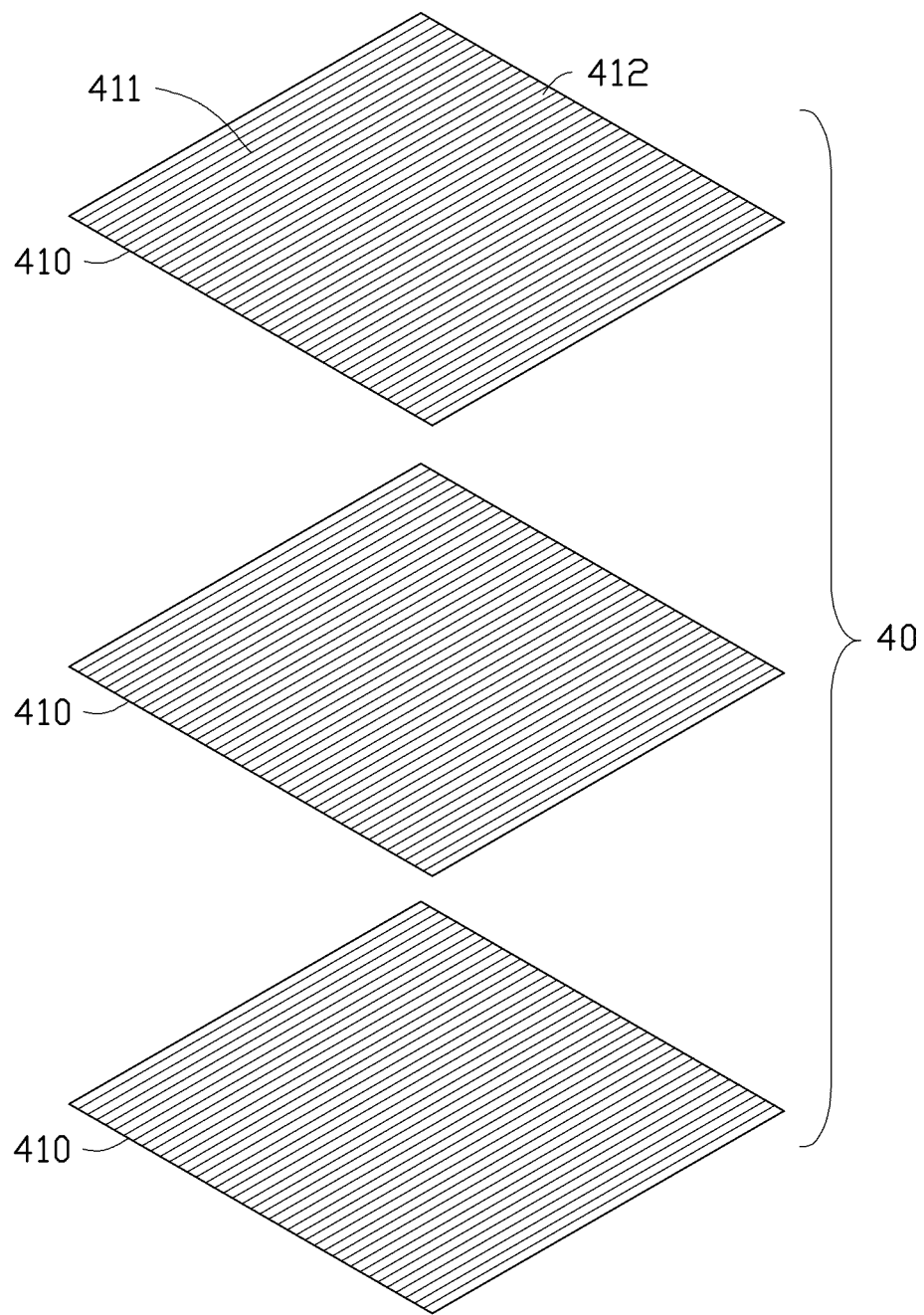
FIG. 3 is a structural view of a carbon nanotube structure used in the method of FIG. 1.

Referring to FIG. 1, FIG. 2 and FIG. 3, one embodiment of a method for making a strip shaped graphene layer 10 includes:

S1, providing a carbon nanotube structure 40 on a surface 201 of a metal substrate 20, wherein the carbon nanotube structure 40 includes at least one drawn carbon nanotube film 410 comprising a plurality of carbon nanotube segments 411, each of the plurality of carbon nanotube segments 411 being substantially parallel to each other and separated from each other by a strip-shaped gap 412;

S2, implanting carbon ions into the metal substrate through the strip-shaped gaps 412; and S3, annealing the metal substrate 20 to obtain the strip shaped graphene layer 10.

In step S1, the metal substrate 20 can be a metal substrate with a thickness in a range from about 100 nanometers to about 100 micrometers. A material of the metal foil can be a transition metal, such as ruthenium, iridium, platinum, nickel, cobalt, copper and iron. In one embodiment, the material of the metal foil is ruthenium. The surface of the metal substrate 20 can be treated to be smooth. The surface 201 of the metal substrate 20 can be heated to become more flat. The flatter the surface 201 of the metal substrate 20, the easier to form the graphene layer on the surface 201 of the metal substrate 20. A shape of the metal substrate 20 is not limited. An area of the metal substrate 20 can be set according to the volume of the chamber used to anneling the metal substrate 20 to grow the strip shaped graphene layer 10. The metal substrate 20 can be rolled up and placed in the chamber with a large area. In one embodiment, the metal substrate 20 is a copper foil with a thickness of about 25 micrometers.

Figure 4:
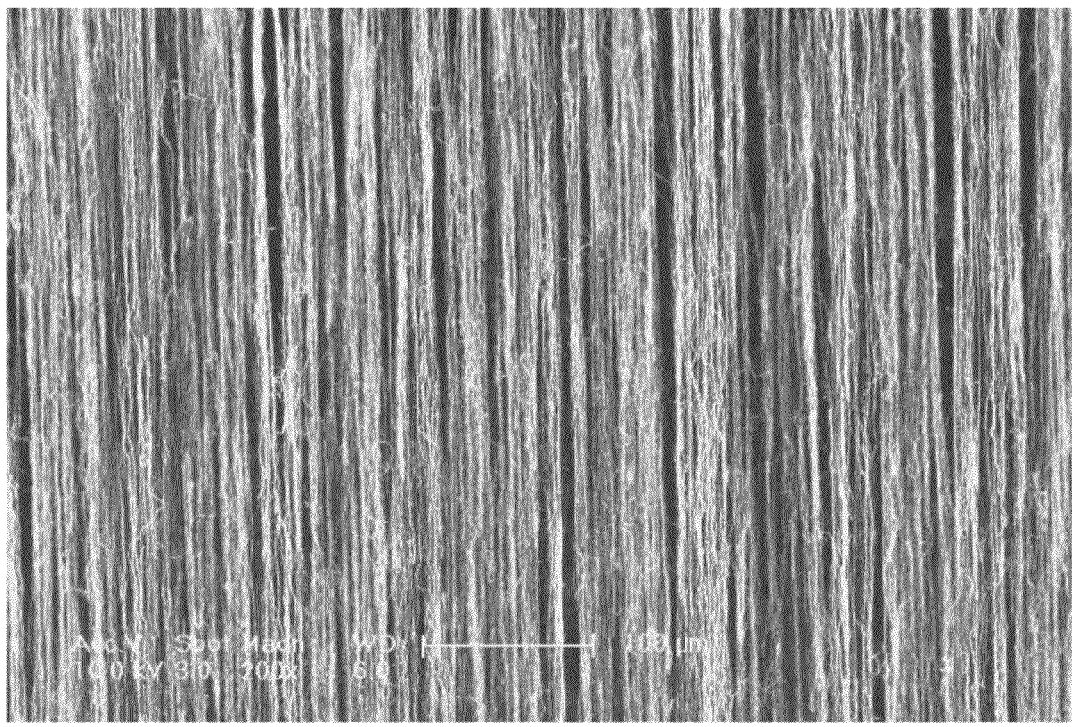
FIG. 4 is a scanning electron microscopic (SEM) image of a drawn carbon nanotube film of the carbon nanotube structure in FIG. 3.

The carbon nanotube structure 40 can include one drawn carbon nanotube film 410 or a plurality of drawn carbon nanotube films 410 stacked with each other. Referring to FIG. 3, in one embodiment, the carbon nanotube structure 40 includes three of the drawn carbon nanotube films 410 stacked with each other, and the carbon nanotubes in each of the drawn carbon nanotube films 410 are aligned along a same direction. Referring to FIG. 4, the drawn carbon nanotube film 410 includes the plurality of carbon nanotube segments 411 substantially parallel to each other, and the plurality of strip-shaped gaps 412 between adjacent ones of the carbon nanotube segments 411. Each of the plurality of carbon nanotube segments 411 includes a plurality of successive and oriented carbon nanotubes joined end-to-end by van der Waals attractive force therebetween. Thus, the carbon nanotubes in the drawn carbon nanotube film 410 are aligned along a same direction and substantially parallel to a surface of the drawn carbon nanotube film 410. A thickness of the drawn carbon nanotube film 410 can be in a range from about 0.5 nanometers to about 100 micrometers. A width of the plurality of strip-shaped gaps 412 can range from about 10 nanometers to about 100 nanometers.

Figure 5:
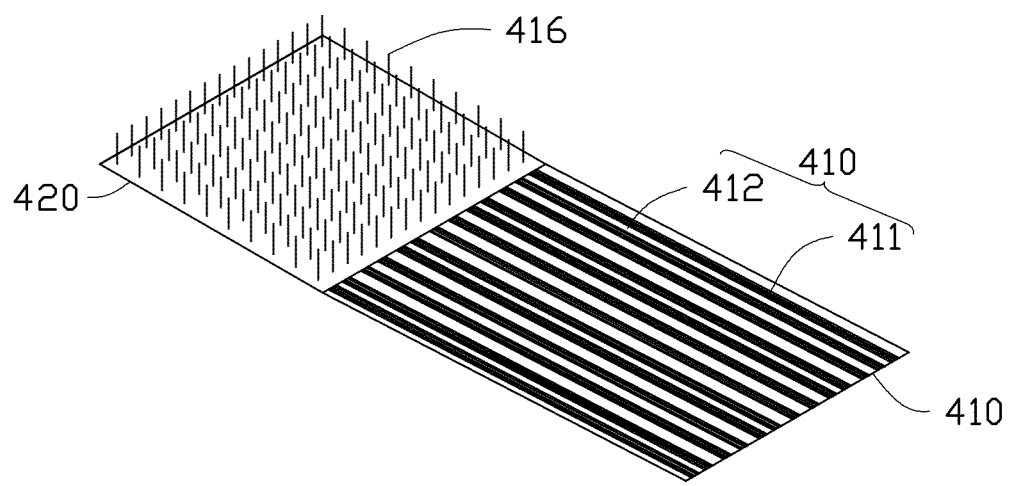
FIG. 5 is a schematic view of a method for making the drawn carbon nanotube film in FIG. 4.

Referring to FIG. 5, the drawn carbon nanotube film 410 can be formed by drawing a film from a carbon nanotube array 416 that is capable of having a film drawn therefrom by using a pulling/drawing tool.

The carbon nanotube array 416 can be formed by a CVD method. The carbon nanotube array 416 is formed on a substrate, and includes a plurality of carbon nanotubes substantially perpendicular to the surface 201 of the substrate. The carbon nanotubes together form the carbon nanotube array 416 located on the surface 201 of the substrate. The carbon nanotube array 416 is essentially free of impurities such as carbonaceous or residual catalyst particles. The carbon nanotubes in the carbon nanotube array 416 are closely packed together by van der Waals attractive force. Accordingly, the drawn carbon nanotube film 410 can be drawn from the carbon nanotube array 416. The length of the carbon nanotubes can be approximately 50 microns to approximately 5 millimeters. In one embodiment, the length of the carbon nanotubes can be approximately ranged from 100 microns to 900 microns. The method for growing the carbon nanotube array 416 is disclosed by patent application US20080248235 to Feng et al.

The pulling/drawing tool can be adhesive tape, pliers, tweezers, or any tool capable of gripping and simultaneously pulling multiple carbon nanotubes. The drawn carbon nanotube film 410 can be pulled/drawn out from the carbon nanotube array 416 by the following steps:

selecting the carbon nanotube segments 411 having a predetermined width from the carbon nanotube array 416; and pulling the carbon nanotube segments 411 at an even/uniform speed to achieve the drawn carbon nanotube film 410 which is uniform.

The carbon nanotube array 416 is capable of having a film drawn therefrom. The carbon nanotube segments 411 having a predetermined width can be selected by using an adhesive tape such as the pulling/drawing tool to contact the carbon nanotube array 416. The carbon nanotube segments 411 include a plurality of carbon nanotubes substantially parallel to each other. The pulling direction is arbitrary (e.g., substantially perpendicular to the growing direction of the carbon nanotube array).

Specifically, during the pulling/drawing process, as the initial carbon nanotube segments 411 are drawn out, other carbon nanotube segments 411 are also drawn out end-to-end due to the van der Waals attractive force between ends of adjacent segments. In general, the initially selected carbon nanotubes are drawn out from the carbon nanotube array 416 by the moving of the drawing tool. The following carbon nanotubes adjacent to the initially selected carbon nanotubes are then drawn out by van der Waals attractive force between the following carbon nanotubes and the initially selected carbon nanotubes thereby forming the drawn carbon nanotube film 410 with the carbon nanotubes joined end-to-end by van der Waals attractive force therebetween. This process of drawing ensures that a continuous, uniform, and free-standing drawn carbon nanotube film 410 having a predetermined width can be formed.

A width of the drawn carbon nanotube film 410 depends on the size of the carbon nanotube array 416. A length of the drawn carbon nanotube film 410 is arbitrary. In one embodiment, if the size of the substrate is 4 inches, the width of the drawn carbon nanotube film 410 is in the approximate range from 1 centimeter to 10 centimeters, and the thickness of the drawn carbon nanotube film 410 is in the approximate range from 0.01 microns to about 100 microns.

The carbon nanotube structure 40 can be formed by the following steps:

providing a frame and adhering first one of the drawn carbon nanotube films 410 to the frame and removing the excess film outside the frame;

adhering second one of the drawn carbon nanotube films 410 to the frame to overlap the first one drawn carbon nanotube film 410, wherein the carbon nanotubes of the first one and the second drawn carbon nanotube films 410 are aligned a long a same direction; and repeating the above steps thereby forming the carbon nanotube structure 40.

For example, two or more such drawn carbon nanotube films 410 can be stacked on each other on the frame to form the carbon nanotube structure 40. The carbon nanotubes in every two adjacent drawn carbon nanotube films 410 are aligned along a same direction.

Because the drawn carbon nanotube film 410 includes the plurality of strip-shaped gaps 411 between adjacent one of the carbon nanotube segments 411, the strip-shaped gaps 412 of the adjacent drawn carbon nanotube films 410 can stack with each other in the carbon nanotube structure 40. The width of the plurality of strip-shaped gaps 412 in the carbon nanotube structure 40 can be controlled by adjusting the number of the stacked drawn carbon nanotube films 410. The width of the plurality of strip-shaped gaps 412 can range from about 10 nanometers to about 100 nanometers. In one embodiment, the width of the plurality of strip-shaped gaps 412 is in a range from about 50 nanometers to about 80 nanometers.

To increase the dimension of the strip-shaped gaps 412 in the carbon nanotube structure 40, the carbon nanotube structure 40 can be treated with an organic solvent.

The carbon nanotube structure 40 can, beneficially, be treated by either of two methods: dropping the organic solvent from a dropper to soak the entire surface of the carbon nanotube structure 40 fixed on a frame or a surface of a supporter, or immersing the frame with the carbon nanotube structure 40 thereon into a container having an organic solvent therein. After being soaked by the organic solvent, the carbon nanotube segments 411 in the drawn carbon nanotube film 410 of the carbon nanotube structure 40 can at least partially shrink and collect or bundle together.

The carbon nanotubes in the drawn carbon nanotube film 410 of the carbon nanotube structure 40 are joined end to end and aligned along a same direction, thus the carbon nanotube segments 411 would shrink in a direction perpendicular to the orientation of the carbon nanotubes. If the drawn carbon nanotube film 410 is fixed on a frame or a surface of a supporter or a substrate, the carbon nanotube segments 411 would shrink into several large carbon nanotube bundles. A distance between the adjacent large carbon nanotube bundles is increased after the above treatment. As such, the dimension of the strip-shaped gaps 412 is increased and can be in a range from about 2 micrometers to about 200 micrometers. Due to the decrease of the specific surface via bundling, the coefficient of friction of the carbon nanotube structure 40 is reduced, but the carbon nanotube structure 40 maintains high mechanical strength and toughness.

The organic solvent is volatilizable and can be ethanol, methanol, acetone, dichloroethane, chloroform, or any combinations thereof.

To increase the dimension of the strip-shaped gaps 412 in the carbon nanotube structure 40, the drawn carbon nanotube films 410 can be treated by a laser beam before stacking with each other to form the carbon nanotube structure 40.

The laser beam treating method includes fixing the drawn carbon nanotube film 410 and moving the laser beam at an even/uniform speed to irradiate the drawn carbon nanotube film 410, thereby increasing the width of the plurality of strip-shaped gaps 412. A laser device used in this process can have a power density greater than $0.1×10^4$ W/m$^2$.

The laser beam is moved along a direction in which the carbon nanotubes are oriented. The carbon nanotubes absorb energy from laser irradiation and the temperature thereof is increased. Some of the carbon nanotubes in the drawn carbon nanotube film 410 will absorb more energy and be destroyed. When the carbon nanotubes along the orientation of the carbon nanotubes in the drawn carbon nanotube film 410 are destroyed due to absorbing too much energy from the laser irradiation, the width of the trip gaps 412 can be in a range from about 2 micrometers to about 200 micrometers.

Figure 6:
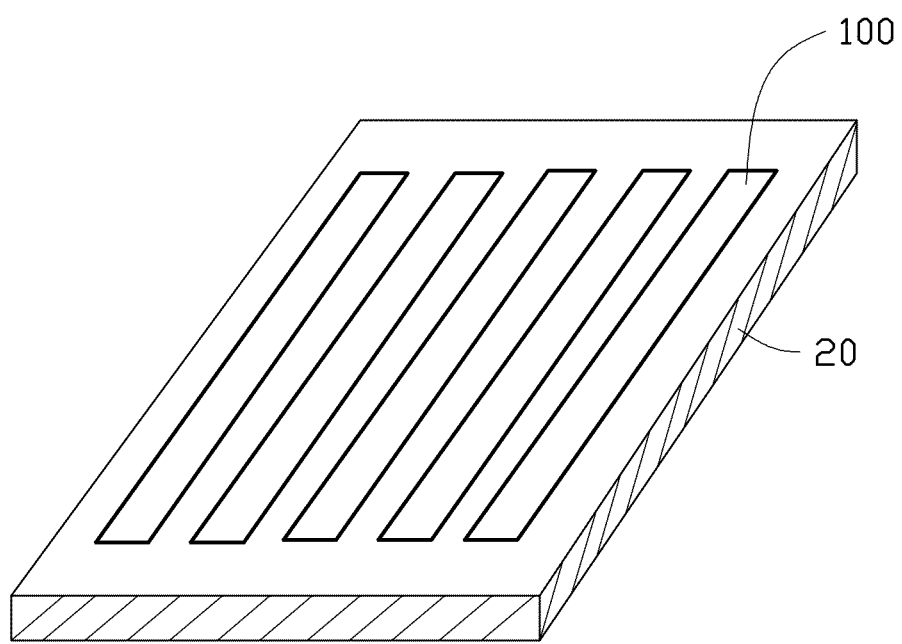
FIG. 6 is a schematic view of a strip carbon ions implanted zone formed in step S2 of the method in FIG. 1.

The carbon nanotube structure 40 is used as a mask to make the carbon ions implanted into the metal substrate 20, and form strip carbon ions implanted zones 100 on the metal substrate 20 corresponding to the strip-shaped gaps 412, as shown in FIG. 6. The size of the strip-shaped gaps 412 in the carbon nanotube structure 40 can be readily adjusted according to needs. Thus, the size of the carbon ions implanted zones can be adjusted. Further, the carbon nanotube structure 40 may be integrally moved out of the metal substrate 20 because the carbon nanotube structure 40 has a self-supporting characteristic. Finally, the carbon nanotube structure 40 has a simple preparation method, low production cost, and manufacturing efficiency advantages.

In step S2, the carbon ions are accelerated in an electrical field and impacted into the metal substrate 20 through the strips 412 of the carbon nanotube structure 40. Therefore, a plurality of strip carbon ion implanted zones 100 is formed on the surface 201 of the metal substrate 20, as shown in FIG. 6. The strip carbon ion implanted zones 100 are exposed out of the carbon nanotube structure 40 via the strip-shaped gaps 412. The strip carbon ion implanted zones 100 have the same pattern as the strip-shaped gaps 412 of the carbon nanotube structure 40. In step S3, carbon ion implantation energy can be in a range from about 1 KeV to about 200 KeV. In one embodiment, the carbon ion implantation energy is in a range from about 10 KeV to about 50 KeV, a carbon ion implantation dose is in a range from about $1×10^{15}$/cm$^2$ to about $1×10^{17}$/cm$^2$. An angle between the accelerating direction of the carbon ions and the surface 201 of the metal substrate 20 can be in a range from about 10 degrees to about 90 degrees. In one embodiment, the angle is in a range from about 45 degrees to about 60 degrees.

In step S3, the metal substrate 20 is annealed in a reacting chamber, the step S4 includes the substeps of:

S31, placing the metal substrate 20 in a reacting chamber;

S32, heating the metal substrate 20 to a predetermined temperature for a predetermined period; and S33, cooling the metal substrate 20 to a room temperature.

In step S31, the reacting chamber can provide a reaction space for forming the strip shaped graphene layer 10. The reacting chamber can have a sealed cavity. The reacting chamber includes a gas inlet and a gas outlet. The gas inlet is used to input gas. The gas outlet is connected with an evacuating device. The evacuating device can be used to adjust the pressure in the reacting chamber. Furthermore, the reacting chamber can include a water cooling device to adjust the temperature in the reacting chamber. The reacting chamber can be a quartz tube furnace. An area of the metal substrate 20 can be adjusted according to the volume of the reacting chamber. The metal substrate 20 with a relatively large area can be bent or curved so that it can be placed in the reacting chamber.

In one embodiment, the reacting chamber is evacuated before heating the metal substrate. In one embodiment, an inert gas can be imported in the reacting chamber through the gas inlet before heating the metal substrate. In step S42, a heating temperature can be in a range from about 550° C. to about 1500° C. A heating period can be in a range from about 20 minutes to about 60 minutes. In one embodiment, the heating temperature is about 1000° C., a temperature rising period is about 40 minutes, and the constant temperature period at the heating temperature is about 20 minutes.

In step S43, during the cooling process, the temperature of the surface 201 of the metal substrate 20 is decreased, thus the solid solubility of the carbon atoms in the strip carbon ions implanted zones 100 of the metal substrate 20 changes with the changing temperature. Therefore, the carbon atoms would separate out and reconfigure to form graphene layers on the strip carbon ion implanted zones 100, and the strip shaped graphene layer 10 is formed.

Furthermore, to separate the carbon nanotube fim structure 40 with the strip shaped graphene layer 10, an ultrasonic treating process is provided. The ultrasonic processing method can be processed before the step S3 and after step S2, or after step S3. The duration of the ultrasonic treating process can be in a range from about 3 minutes to about 30 minutes. In one embodiment, the carbon nanotube structure 40 on the substrate 20 is treated by ultrasonic after step S3, and the duration of the ultrasonic treating process is 10 minutes.

Figure 7:
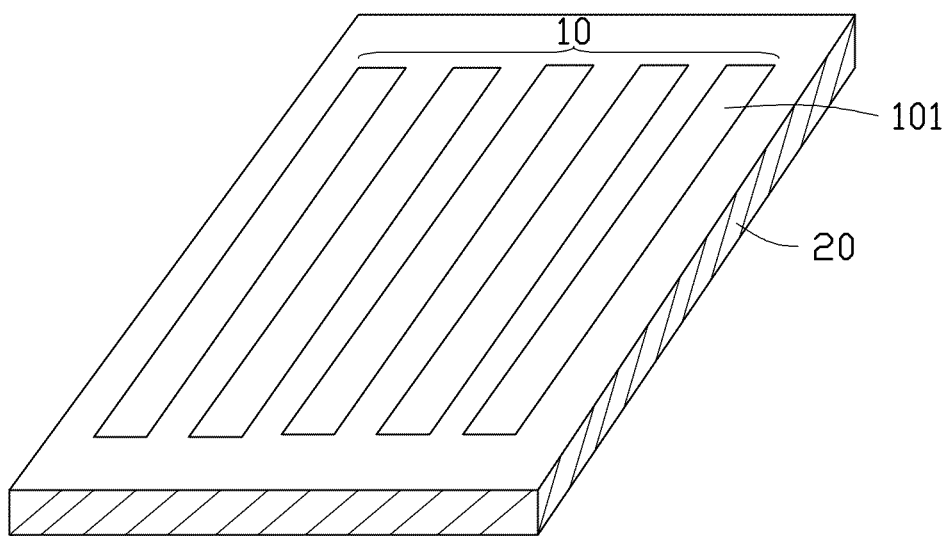
FIG. 7 is a schematic view of one strip shaped graphene layer obtained by the method of FIG. 1.
Figure 8:
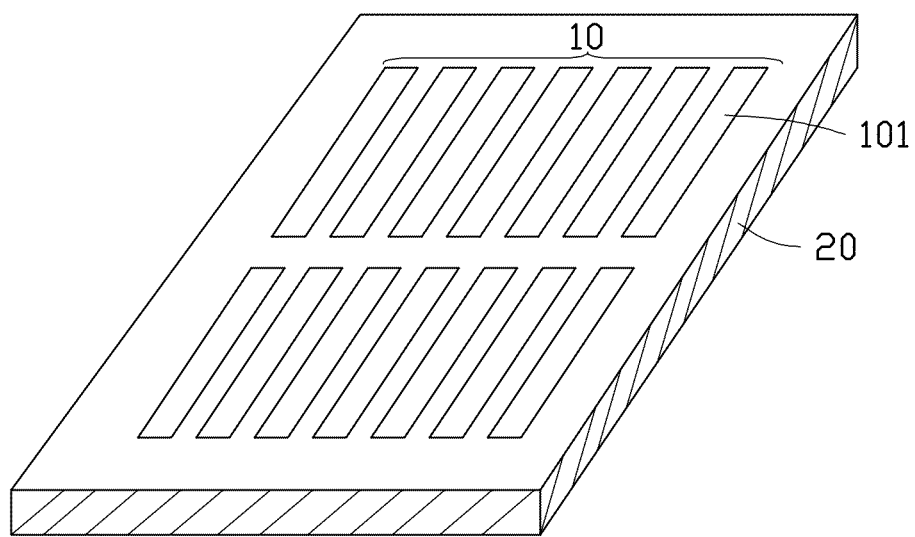
FIG. 8 is a schematic view of another strip shaped graphene layer obtained by the method of FIG. 1.

As shown in FIG. 7 and FIG. 8, a strip shaped graphene layer 10 is located on the substrate. The strip shaped graphene layer 10 includes a plurality of graphene strips 101 aligned along a same direction and substantially parallel to each other. The strip shaped graphene layer 10 can be used as conductive layers in semi-conductive devices. Each of the plurality of graphene strips 101 is corresponding to one of the strip carbon ion zone 100.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for making a strip shaped graphene layer comprising:

providing a carbon nanotube structure on a surface of a metal substrate, wherein the carbon nanotube structure comprises at least one drawn carbon nanotube film comprising a plurality of carbon nanotube segments, each of the plurality of carbon nanotube segments is substantially parallel to each other and separated from each other by a strip-shaped gap;

implanting carbon ions into the metal substrate through the strip-shaped gaps; and annealing the metal substrate with the implanted carbon ions to obtain the strip shaped graphene layer.

2. The method of claim 1, wherein the metal substrate has a thickness in a range from about 100 nanometers to about 100 micrometers.

3. The method of claim 2, wherein the metal substrate is made of copper or nickel.

4. The method of claim 1, wherein a width of the strip-shaped gaps is in a range from a bout 20 nanometers to about 80 nanometers.

5. The method of claim 1, wherein the at least one drawn carbon nanotube film of the carbon nanotube structure comprises a plurality of drawn carbon nanotube films stacked with each other.

6. The method of claim 5, wherein each of the plurality of drawn carbon nanotube films is made by steps of:
providing a carbon nanotube array;
selecting a carbon nanotube segment having a predetermined width from the carbon nanotube array; and
pulling the carbon nanotube segment at a uniform speed to form one of the at least one drawn carbon nanotube films which is uniform.

7. The method of claim 1, wherein the carbon ions are accelerated in an electrical field and impacted into the metal substrate through the strip-shaped gaps of the carbon nanotube structure.

8. The method of claim 7, wherein a plurality of strip carbon ion implanted zones is formed on the surface of the metal substrate, and exposed out of the carbon nanotube structure via the strip-shaped gaps.

9. The method of claim 8, wherein the strip carbon ion implanted zones have the same pattern as the strip-shaped gaps.

10. The method of claim 7, wherein the carbon ion implantation energy of the electrical field is in a range from about 10 KeV to about 50 KeV.

11. The method of claim 7, wherein the carbon ion implantation dose is in a range from about $1\times10^{15}/cm^2$ to about $1\times10^{17}/cm^2$.

12. The method of claim 7, wherein an angle between the accelerating direction of the carbon ions and the surface of the metal substrate is in a range from about 10 degrees to about 90 degrees.

13. The method of claim 1, wherein the step of annealing the metal substrate comprises steps of:
placing the metal substrate in a reacting chamber;
heating the metal substrate to a predetermined temperature for a predetermined period; and
cooling the metal substrate to a room temperature.

14. The method of claim 13, wherein the step of annealing the metal substrate is processed in a vacuum environment or an inert gas environment.

15. The method of claim 13, wherein the predetermined temperature is in a range from about 550° C. to about 1500° C., and the predetermined period is in a range from about 20 minutes to about 60 minutes.

16. A method for making a strip shaped graphene layer comprising:
providing a carbon nanotube structure on a surface of a metal substrate, wherein the carbon nanotube structure comprises at least one drawn carbon nanotube film comprising a plurality of carbon nanotube segments, each of the plurality of carbon nanotube segments being substantially parallel to each other and separated from each other by a strip-shaped gap;
implanting carbon ions into the metal substrate through the strip-shaped gaps;
removing the carbon nanotube structure from the metal substrate; and
annealing the metal substrate with the implanted carbon ions to obtain the strip shaped graphene layer.

17. The method of claim 16, wherein the carbon ions are accelerated in an electrical field and impacted into the metal substrate through the strip-shaped gaps of the carbon nanotube structure.

18. The method of claim 17, wherein a plurality of strip carbon ion implanted zones is formed on the surface of the metal substrate, and exposed out of the carbon nanotube structure via the strip-shaped gaps.

19. The method of claim 18, wherein the strip carbon ion implanted zones have the same pattern the strip-shaped gaps.

* * * * *